United States Patent
Yuan et al.

(10) Patent No.: US 12,400,399 B1
(45) Date of Patent: Aug. 26, 2025

(54) METHOD FOR CONSTRUCTING DIGITAL TWIN MONITORING MODEL FOR SLOPES BASED ON PROXY MODEL

(71) Applicant: Shijiazhuang Tiedao University., Shijiazhuang (CN)

(72) Inventors: Wei Yuan, Shijiazhuang (CN); Fangshi Shi, Shijiazhuang (CN); Wenjing Xu, Shijiazhuang (CN); Wei Wang, Shijiazhuang (CN); Wen Wang, Shijiazhuang (CN); Xinzhan Qin, Shijiazhuang (CN)

(73) Assignee: Shijiazhuang Tiedao University, Shijiazhuang (CN)

( * ) Notice: Subject to any disclaimer, the term of this patent is extended or adjusted under 35 U.S.C. 154(b) by 0 days.

(21) Appl. No.: 19/173,312

(22) Filed: Apr. 8, 2025

(30) Foreign Application Priority Data

Nov. 15, 2024 (CN) .................. 202411631942.X

(51) Int. Cl.
*G06T 17/05* (2011.01)
*G06F 30/27* (2020.01)
*G06T 17/20* (2006.01)

(52) U.S. Cl.
CPC .............. *G06T 17/05* (2013.01); *G06F 30/27* (2020.01); *G06T 17/20* (2013.01)

(58) Field of Classification Search
CPC ................................ G06T 17/05; G06T 17/20
See application file for complete search history.

(56) References Cited

U.S. PATENT DOCUMENTS 12,130,401 B1 * 10/2024 Fang .................. G08B 21/10

FOREIGN PATENT DOCUMENTS

CN 114330168 A * 4/2022 ............ E02D 17/20

OTHER PUBLICATIONS

Shijiazhuang Tiedao University (Applicant), Claims (allowed) of CN202411631942.X, Nov. 15, 2024.
CNIPA, Notification to grant patent right for invention in CN202411631942.X, Dec. 23, 2024.

* cited by examiner

*Primary Examiner* — Ryan McCulley
(74) *Attorney, Agent, or Firm* — Hemisphere Law, PLLC; Zhigang Ma

(57) ABSTRACT

A method for constructing a digital twin monitoring model for slopes based on a proxy model includes S101-S104. S101, a slope geometric model consisting of M triangular facets is constructed. S102, a first training dataset is constructed for pretraining a pre-proxy model by using the slope geometric model. S103, monitoring data of the M triangular facets are collected in real-time to construct a second training dataset for training the proxy model. S104, a warning cloud map of the slopes is generated. The method uses the slope geometric model to obtain simulation data under multiple physical field conditions. It constructs training dataset of pretraining pre-proxy model based on the simulation data, which greatly reduces training samples. Moreover, the multiple base learners in the proxy model can reduce the computational bias of a single time-series analysis model, improving the prediction accuracy of the proxy model.

10 Claims, 4 Drawing Sheets

S101 Collecting elevation information of the slopes by using a drone oblique photography technology, and constructing a slope geometric model consisting of triangular facets with a number of M by using a 3D reconstruction software

S102 Performing, by using the slope geometry model, simulation experiments under multiple physical field conditions to obtain simulation data and simulation results, constructing, based on the simulation data and simulation results, a first training dataset for pretraining a pre-proxy model, and pretraining, based on the first training dataset, the pre-proxy model to thereby obtain a pretrained pre-proxy model

S103 Transferring the pretrained pre-proxy model to the proxy model, collecting monitoring data of the M triangular facets in real-time to construct a second training dataset for training the proxy model, and training, based on the second training dataset, the proxy model to thereby obtain a trained proxy model

S104 Inputting the monitoring data of the M triangular facets into the trained proxy model to obtain an output of the trained proxy model, and generating a warning cloud map of the slopes based on the output of the trained proxy model

FIG. 1

METHOD FOR CONSTRUCTING DIGITAL TWIN MONITORING MODEL FOR SLOPES BASED ON PROXY MODEL

CROSS-REFERENCE TO RELATED APPLICATION

This application claims priority to Chinese Patent Application No. 202411631942.X, filed Nov. 15, 2024, which is herein incorporated by reference in its entirety.

TECHNICAL FIELD

The disclosure relates to the technical field of slope warning, and particularly to a method for constructing a digital twin monitoring model for slopes based on a proxy model.

BACKGROUND

Slopes are widely present in mountainous areas such as roads, railway lines, and mining areas, and are affected by various factors such as geological conditions, hydrological environment, and climate change. They are prone to geological disasters such as landslides and collapses, and their stability directly affects people's life and property safety.

Existing slope early-warning systems mainly rely on monitoring data collected by various sensors distributed on the slopes, such as displacement gauges, tilt meters, water level gauges, and rain gauges. These systems can collect key slope parameters like displacement, tilt angle, groundwater level, and rainfall amount in real-time, and generate early-warning information when thresholds are exceeded. However, static threshold settings may fail to adapt to dynamic environmental changes, leading to false alarms or missed alarms. With the development of big data technology, time series analysis-based slope early-warning systems have emerged, using models like long short-term memory (LSTM) or gated recurrent unit (GRU). These models extract patterns from historical sensor data to predict future slope physical properties such as displacement and soil pressure. Yet, single time series analysis models may lack long-term forecasting ability or be overly data-dependent, resulting in low prediction accuracy.

Therefore, there is an urgent need for a method for monitoring slopes based on a proxy model for slopes based on a proxy model to address the above problems.

SUMMARY

The disclosure provides a method for monitoring slopes based on a proxy model to solve above problems.

The method includes steps as follows.

S101, elevation information of the slopes is collected by using a drone oblique photography technology, and a slope geometric model consisting of triangular facets with a number of M is constructed by using a three-dimension (3D) reconstruction software.

S102, simulation experiments are performed by using the slope geometry model under multiple physical field conditions to obtain simulation data and simulation results, a first training dataset is constructed based on the simulation data and simulation results for pretraining a pre-proxy model, and the pre-proxy model is pretrained based on the first training dataset to thereby obtain a pretrained pre-proxy model. The multiple physical field conditions include: a rainfall condition, an earthquake condition, and a mining condition in a mining area. The simulation data includes center coordinate points and test data of the M triangular facets at a current time, the center coordinate points are represented by a horizontal coordinate value X, a vertical coordinate value Y, and an elevation coordinate value Z. The test data includes temperatures, rainfalls, soil moistures, groundwater levels, wind speeds, wind direction slope deviation angles, and vegetation densities. The simulation results are represented by structural response values of the M triangular facets at the current time, and the structural response values include pore water pressures, displacements, and soil pressures. An input of the pre-proxy model is the simulation data after preprocessing, and an output of the pre-proxy model is the simulation results. The first training dataset includes training samples with a number of A, each of the A training samples includes a first sample data and a first sample label corresponding to the first sample data, the first sample data of each of the A training samples corresponds to the input of the pre-proxy model, and a third sample label corresponds to the output of the pre-proxy model.

S103, the pretrained pre-proxy model is transferred to the proxy model and monitoring data of the M triangular facets are collected in real-time to construct a second training dataset for training the proxy model. The proxy model is trained based on the second training dataset to thereby obtain a trained proxy model. The monitoring data of the M triangular facets are represented in a same way as the simulation data. An input of the proxy model is the input of the pre-proxy model, an output of the proxy model is warning values of the M triangular facets at a future time point G, and the warning values are generated based on structural response values of the M triangular facets at the future time point G. The second training dataset includes training samples with a number of B, each of the B training samples includes a second sample data and a second sample label corresponding to the second sample data, the second sample data of each of the B training samples corresponds to the input of the proxy model, a fourth sample label corresponds to the output of the proxy model.

S104, the monitoring data of the M triangular facets are input into the trained proxy model, and a warning cloud map of the slopes is generated based on the output of the trained proxy model.

In an embodiment, the number M of the triangular facets in the slope geometric model, the number A of the training samples in the first training dataset, the number B of the training samples in the second training dataset, and the future time point G are custom parameters.

In an embodiment, a process for preprocessing the center coordinate points and the test data of the M triangular facets at the current time includes S201-S203.

S201, the wind direction slope deviation angles and the vegetation densities in the test data are converted into numerical values. A calculation formula for a wind direction slope deviation angle $\Delta\theta_m$ of an m-th triangular facet of the M triangular facets is expressed as follows:

$$\Delta\theta_m = \cos\left|\frac{\theta_m^w}{\theta_m^s}\right|$$

where m is greater than or equal to 1 and less than or equal to M; $\theta_m^w$ represents a wind direction of the m-th triangular facet, a wind direction in a truth north is represented by 0°, a clockwise direction is defined as a positive direction, $\theta_m^w$ is in a range from 0° to 360°; $\theta_m^s$ represents a slope of the m-th triangular facet, $\theta_m^s$ is an angle between the m-th triangular facet and a ground plane, and $\theta_m^s$ is in a range from 0° to 90°. A calculation formula for a vegetation density Density$_m$ of the m-th triangular facet is expressed as follows:

$$\text{Density}_m = 2.5 \times \frac{(NIR_m - \text{Red}_m)}{(NIR_m + 6 \times \text{Red}_m - 7.5 \times \text{Blue}_m + 1)}$$

where $NIR_m$, $\text{Red}_m$ and $\text{Blue}_m$ represent reflectance values of the m-th triangular facet in a near-infrared band, a red band, and a blue band, respectively.

S202, an average value of center coordinate points of every two adjacent triangular facets of the M triangular facets and an average value of the test data of the every two adjacent triangular facets of the M triangular facets are determined, and missing values are filled into the simulation data based on the average value of the center coordinate points of the every two adjacent triangular facets of the M triangular facets and the average value of the test data of the every two adjacent triangular facets of the M triangular facets.

S203, the center coordinate points and the test data of the M triangular facets are normalized, and a calculation formula for the normalizing is expressed as follows:

$$\widetilde{\text{Data}_m} = \frac{\text{Data}_m - \min(\text{Data})}{\max(\text{Data}) - \min(\text{Data})}$$

where $1 \leq m \leq M$; $\widetilde{\text{Data}_m}$ and $\text{Data}_m$ represent the center coordinate points and the test data of the m-th triangular facet after the preprocessing and before the preprocessing, respectively; and min(Data) and max(Data) represent a minimum value and a maximum value of the center coordinate points and the test data of the M triangular facets.

In an embodiment, the pre-proxy model includes parallel modules with a number of M, the M parallel modules share weight parameters and bias parameters, and each of the M parallel modules includes a first hidden layer, a concatenation layer, and a second hidden layer. The first hidden layer includes a first unit, a second unit, a third unit, a fourth unit, and a fifth unit. Preprocessed center coordinate points and test data of an m-th triangular facet of the M triangular facets are input into the first unit, the second unit, the third unit, the fourth unit, and the fifth unit of the first hidden layer of an m-th parallel module of the M parallel modules, and a structural response value of the m-th triangular facet is output by each of the first unit, the second unit, the third unit, the fourth unit, and the fifth unit of the first hidden layer of an m-th parallel module of the M parallel modules. The concatenation layer of the m-th parallel module is configured to concatenate the structural response value of the m-th triangular facet output by the first, second, third, fourth, and fifth units of the first hidden layer of the m-th parallel module. The concatenation layer of the m-th parallel module is configured to output a combined vector of a size of 1×15. The combined vector output by the concatenation layer of the m-th parallel module is input into the second hidden layer of the m-th parallel module, and the structural response value of the m-th triangular facet is output by the second hidden layer of the m-th parallel module. The proxy model includes the pre-proxy model, and an output of a second hidden layer of the proxy model is represented as the structural response value at the future time point G. The proxy model includes a linear layer, and the linear layer is configured to generate the warning values based on the structural response values of the M triangular facets at the future time point G.

In an embodiment, the first unit is constructed based on an extreme gradient boosting decision tree (XGBoost), the second unit is constructed based on a support vector machine with radial basis function, the third unit is constructed based on a support vector machine with polynomial kernel function, the fourth unit is constructed based on random forest, and the fifth unit is constructed based on a K-nearest neighbor algorithm.

In an embodiment, the second hidden layer is constructed based on a light gradient boosting machine (LightGBM).

In an embodiment, the training, based on the second training dataset, the proxy model to thereby obtain a trained proxy model includes steps as follows. The proxy model is trained by using a five-fold cross-validation method, the second training dataset is divided into five equally-sized subsets. In each training iteration, one of the five equally-sized subsets is selected to serve as a validation set and the remaining four of the five equally-sized subsets is selected as a training set.

In an embodiment, a calculation formula for a loss function Loss$_1$ of the pre-proxy model is expressed as follows:

$$\text{Loss}_1 = \frac{1}{A} \times \sum_{a=1}^{A} (\tilde{y}_a - y_a)^2$$

where $\tilde{y}_a$ represents an output value (i.e., the third sample label) of the pre-proxy model when sample data of a-th training sample in the first training dataset is input into the pre-proxy model; $y_a$ represents a sample label (i.e., the first sample label) of the a-th training sample. A calculation formula for a loss function Loss$_2$ of the proxy model is expressed as follows:

$$\text{Loss}_2 = \begin{cases} \frac{1}{2}(\widetilde{y_b} - y_b)^2, & \text{if}|\widetilde{y_b} - y_b| \leq \delta \\ \delta|\widetilde{y_b} - y_b| - \frac{1}{2}\delta^2, & \text{if}|\widetilde{y_b} - y_b| > \delta \end{cases}$$

where $1 \leq b \leq B$; $\widetilde{y_b}$ represents an output value (i.e., the fourth sample label) of the proxy model when sample data of b-th training sample in the second training dataset is input into the pre-proxy model; $y_b$ represents a sample label (i.e., the second sample label) of the b-th training sample; and $\delta$ represents a custom parameter.

In an embodiment, a calculation formula for a warning value Fore$_m$ of an m-th triangular facet of the M triangular facets is expressed as follows:

$$\text{Fore}_m = \frac{255}{1 + e^{-(u_1 \times water_m + u_2 \times move_m + u_3 pressure_m)}}$$

where $1 \leq m \leq M$; $water_m$, $move_m$, and $pressure_m$ represent a pore water pressure, a displacement, and a soil pressure of the m-th triangular facet respectively; $u_1$, $u_2$, and $u_3$ represent a first weight coefficient, a second weight coefficient, and a third weight coefficient, respectively;

and $u_1$, $u_2$, and $u_3$ are the custom parameters, and a sum of $u_1$, $u_2$, and $u_3$ is 1, and e represents a natural constant.

In an embodiment, the generating a warning cloud map of the slopes based on the output of the trained proxy model includes a step as follows. The warning values of the M triangular facets are rendered onto the corresponding M triangular facets by using a unity rendering engine, respectively, thereby to generate the warning cloud map of the slopes.

The benefits of the disclosure are as follows. This disclosure uses the slope geometric models to get simulation data in multiple physical field conditions. It constructs a pretraining proxy model training dataset from the simulation data, greatly cutting the number of training samples needed for the proxy model. In addition, the multiple base learners in the proxy model reduce the computational bias of a single time-series analysis model, improving the prediction accuracy of the proxy model.

BRIEF DESCRIPTION OF DRAWINGS

FIG. 1 illustrates a flowchart of a method for constructing a digital twin monitoring model for slopes based on a proxy model in the disclosure.

DETAILED DESCRIPTION OF EMBODIMENTS

Figure 2:
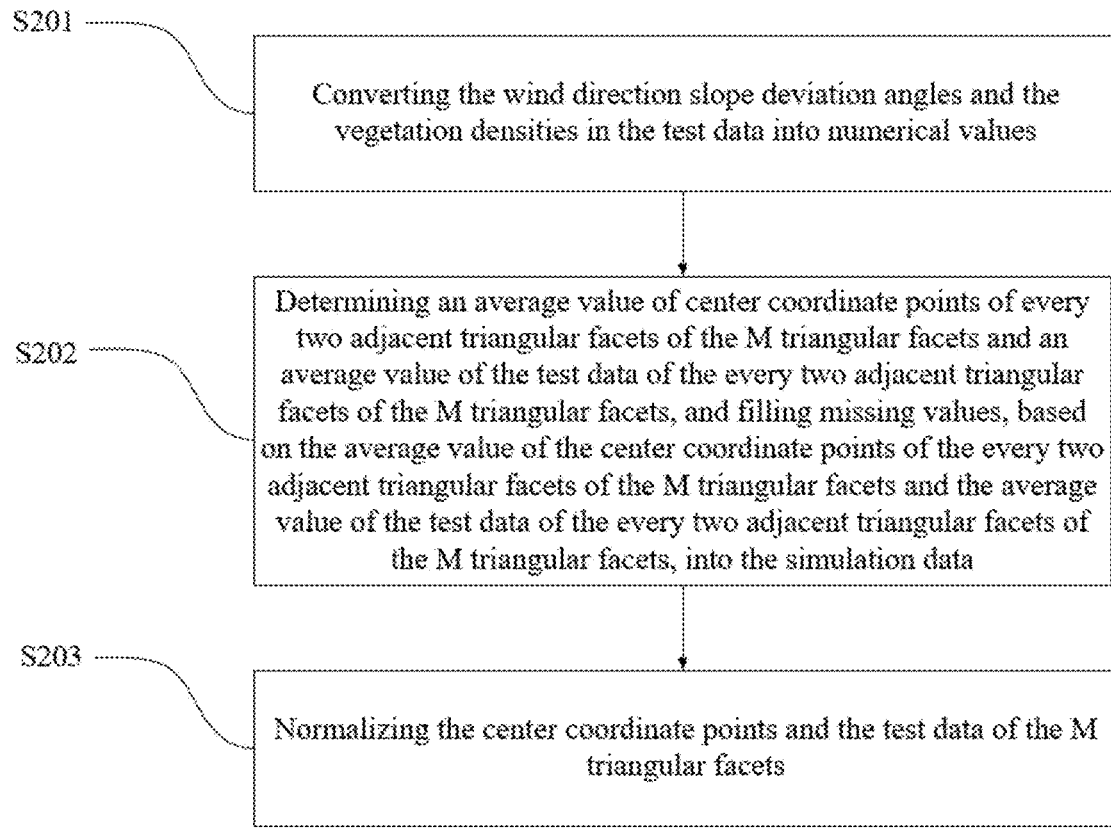
FIG. 2 illustrates a flowchart of preprocessing center coordinate points and test data of M triangular facets in the disclosure.
Figure 3:
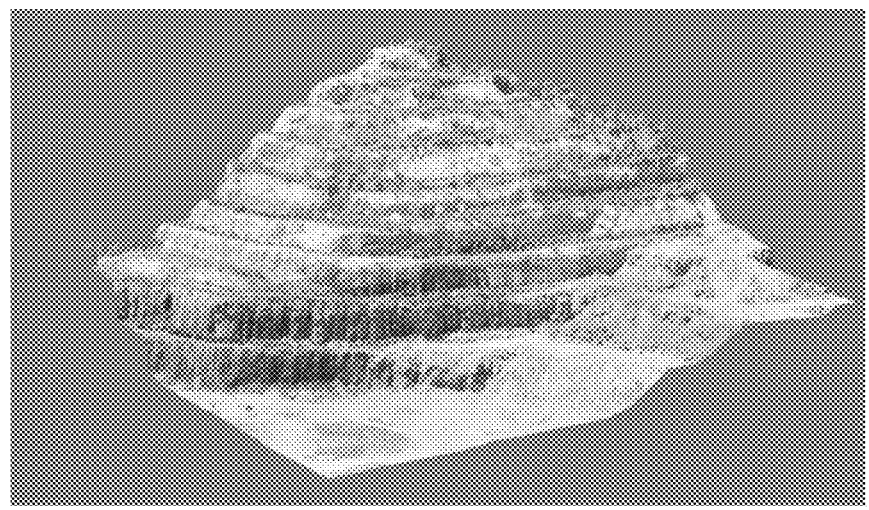
FIG. 3 illustrates a schematic diagram of a slope based on a drone oblique photography technology in the disclosure.
Figure 4:
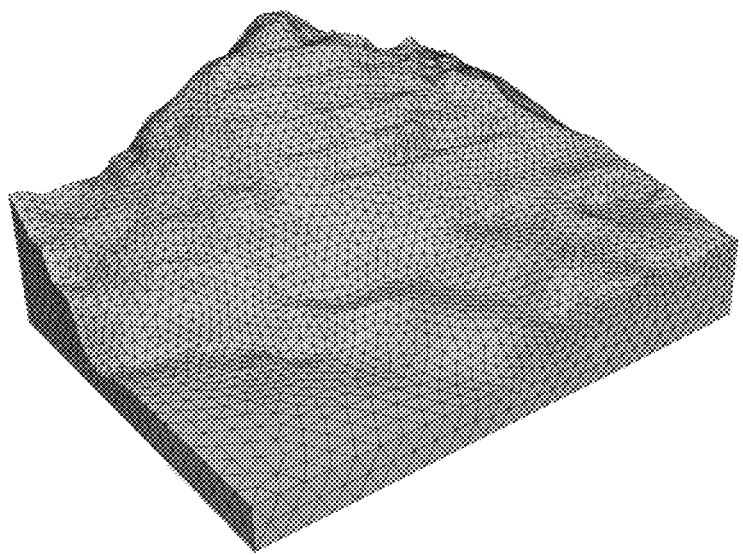
FIG. 4 illustrates a schematic diagram of a slope geometric model in the disclosure.
Figure 5:
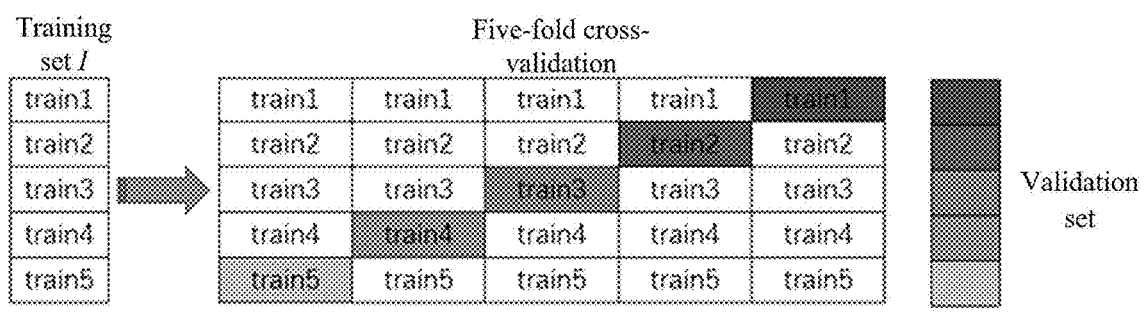
FIG. 5 illustrates a schematic diagram of a five-fold cross-validation in the disclosure.
Figure 6:
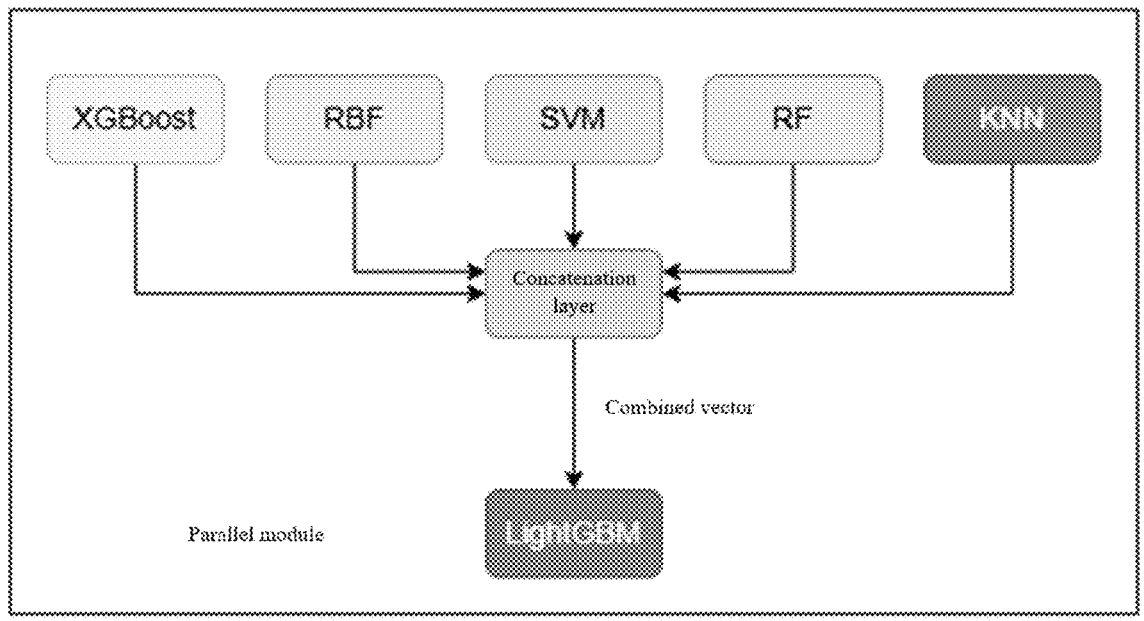
FIG. 6 illustrates a schematic diagram of a parallel module in the disclosure.
Figure 7:
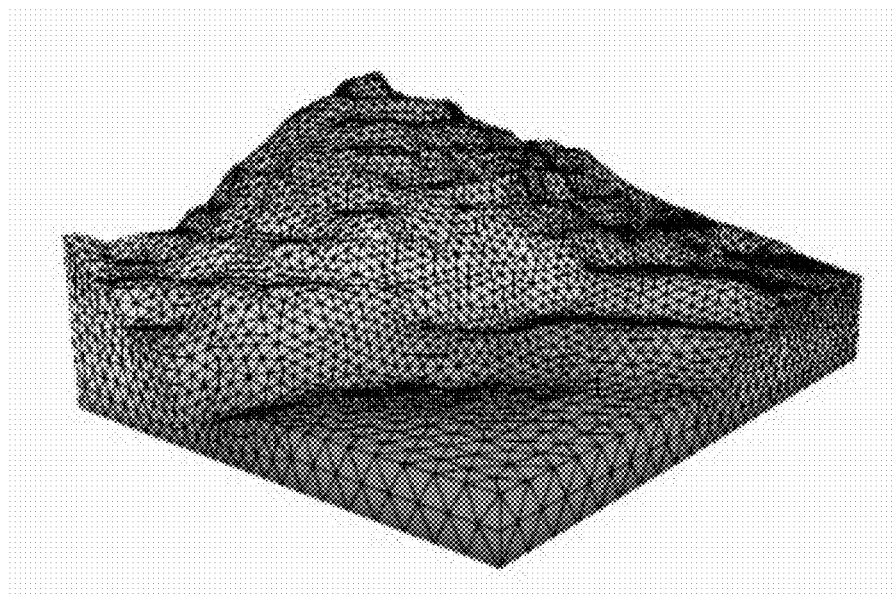
FIG. 7 illustrates a schematic diagram of a warning cloud map of the slopes in the disclosure.

The subject described in the disclosure will now be discussed with reference to embodiments. It should be understood that the discussion of the embodiments is to help those skilled in the art better understand and implement the subject described. Changes to the functions and arrangements of the elements discussed can be made without departing from the scope of protection of the disclosure. Various examples may omit, substitute, or add various processes or components as needed. Also, features described concerning some examples can be combined in other examples.

It should be noted that, unless otherwise defined, the technical or scientific terms used in one or more embodiments of the disclosure shall have the ordinary meanings understood by those skilled in the art to which the disclosure pertains. The terms "first", "second", and the like, used in one or more embodiments of the disclosure do not denote any order, quantity, or importance, but are merely used to distinguish different components. Words like "include" or "contain" mean that the element or object preceding the word encompasses those listed after the word and their equivalents, without excluding other elements or objects. Words like "connect" or "link" do not limit to physical or mechanical connections, but may include electrical connections, whether direct or indirect. Terms like "upper", "lower", "left", "right" are used to indicate relative position relationships, which may change accordingly when the absolute position of the described object changes.

As shown in FIGS. 1-7, a method for constructing a digital twin monitoring model for slopes based on a proxy model is provided, which includes S101-S104 as follows.

S101, elevation information of the slopes is collected by using a drone oblique photography technology, and a slope geometric model consisting of triangular facets with a number of M is constructed by using a three-dimension (3D) reconstruction software.

S102, Simulation experiments are performed by using the slope geometry model under multiple physical field conditions to obtain simulation data and simulation results, a first training dataset is constructed based on the simulation data and simulation results for pretraining a pre-proxy model, and the pre-proxy model is pretrained based on the first training dataset to thereby obtain a pretrained pre-proxy model.

Specifically, the multiple physical field conditions include: a rainfall condition, an earthquake condition, and a mining condition in a mining area. The simulation data includes center coordinate points and test data of the M triangular facets at a current time, the center coordinate points are represented by a horizontal coordinate value X, a vertical coordinate value Y, and an elevation coordinate value Z. The test data includes temperatures, rainfalls, soils moistures, groundwater levels, wind speeds, wind direction slope deviation angles, and vegetation densities. The simulation results are represented by structural response values of the M triangular facets at the current time, and the structural response values include pore water pressures, displacements, and soil pressures. An input of the pre-proxy model is the simulation data after preprocessing, and an output of the pre-proxy model is the simulation results. The first training dataset includes training samples with a number of A, each of the training samples includes a first sample data and a first sample label corresponding to the first sample data, the first sample data of each of the A training samples corresponds to the input of the pre-proxy model, and a third sample label corresponds to the output of the pre-proxy model.

S103, the pretrained pre-proxy model is transferred to the proxy model and monitoring data of the M triangular facets are collected in real-time to construct a second training dataset for training the proxy model. The proxy model is trained based on the second training dataset to thereby obtain a trained proxy model. The monitoring data of the M triangular facets are represented in a same way as the simulation data. An input of the proxy model is the input of the pre-proxy model, an output of the proxy model is warning values of the M triangular facets at a future time point G, and the warning values are generated based on structural response values of the M triangular facets at the future time point G. The second training dataset includes training samples with a number of B, each of the B training samples includes a second sample data and a second sample label corresponding to the second sample data, the second sample data of each of the B training samples corresponds to the input of the proxy model, and a fourth sample label corresponds to the output of the proxy model.

S104, the real-time monitoring data of the M triangular facets are input into the trained proxy model, and a warning cloud map of the slopes is generated based on the output of the trained proxy model.

It should be noted that drones with high-definition cameras capture images of the slopes from multiple angles, and the multiple angles include vertical downward, leftward tilt of 30°, rightward tilt of 30°, forward tilt of 30°, and backward tilt of 30°. Images corresponding to the vertical downward is configured to provide planar information of the Earth's surface and are the foundation for constructing orthophoto maps, images corresponding to the leftward tilt of 30° are configured to capture left terrain features, images corresponding to the rightward tilt of 30° are configured to capture right terrain features, and images corresponding to the forward tilt of 30° and the backward tilt of 30° are configured to ensure to cover the entire slope. The captured images are imported into the 3D reconstruction software, which generates a dense point-cloud model, and each point represents a three-dimensional coordinate of a slope surface. Every adjacent two points in the dense point-cloud model are connected to form the M triangular facets. The 3D reconstruction software can also perform point-cloud denoising and thinning to enhance quality of the slope geometric model. The 3D reconstruction software may be agisoft metashape or pix4dmapper, and using such software for slope geometric modeling is a conventional technique and will not be repeated herein.

In an embodiment, the number M of the triangular facets in the slope geometric model, the number A of the training samples in the first training dataset, the number B of the training samples in the second training dataset, and the future time point G are custom parameters. The number M is determined by geological experts based on a volume of slopes, and a default value of the number M is 2000. Default values of A, B, and G are 2000, 500, and 1 hour, respectively.

In an embodiment, as shown in FIG. 2, the center coordinate points and the test data of the M triangular facets at the current time are preprocessed, which includes S201-S203.

S201, the wind direction slope deviation angles and the vegetation densities in the test data are converted into numerical values. A calculation formula for a wind direction slope deviation angle $\Delta\theta_m$ of an m-th triangular facet of the M triangular facets is expressed as follows:

$$\Delta\theta_m = \cos\left|\frac{\theta_m^w}{\theta_m^s}\right|$$

where m is greater than or equal to 1 and less than or equal to M; $\theta_m^w$ represents a wind direction of the m-th triangular facet, a wind direction in a truth north is represented by 0°, a clockwise direction is defined as a positive direction, $\theta_m^w$ is in a range from 0° to 360°; $\theta_m^s$ represents a slope of the m-th triangular facet, $\theta_m^s$ is an angle between the m-th triangular facet and a ground plane, and $\theta_m^s$ is in a range from 0° to 90°. A calculation formula for a vegetation density $Density_m$ of the m-th triangular facet is expressed as follows:

$$Density_m = 2.5 \times \frac{(NIR_m - Red_m)}{(NIR_m + 6 \times Red_m - 7.5 \times Blue_m + 1)}$$

where $NIR_m$, $Red_m$ and $Blue_m$ represent reflectance values of the m-th triangular facet in a near-infrared band, a red band, and a blue band, respectively.

S202, an average value of center coordinate points of every two adjacent triangular facets of the M triangular facets and an average value of the test data of the every two adjacent triangular facets of the M triangular facets are determined, and missing values are filled into the simulation data based on the average value of the center coordinate points of the every two adjacent triangular facets of the M triangular facets and the average value of the test data of the every two adjacent triangular facets of the M triangular facets.

S203, the center coordinate points and the test data of the M triangular facets are normalized, and a calculation formula for the normalizing is expressed as follows:

$$\widetilde{Data}_m = \frac{Data_m - \min(Data)}{\max(Data) - \min(Data)}$$

where $1 \leq m \leq M$; $\widetilde{Data}_m$ and $Data_m$ represent the center coordinate points and the test data of the m-th triangular facet after the preprocessing and before the preprocessing, respectively; and min(Data) and max(Data) represent a minimum value and a maximum value of the center coordinate points and the test data of the M triangular facets.

It should be noted that the reflectance value of the near-infrared band, the reflectance value of the red band, and the reflectance value of the blue band can be obtained by the drones equipped with hyperspectral cameras. In addition, filling the missing values into the simulation data can ensure an integrity of the input data, the normalization can prevent large differences in magnitude between the input data from causing bias, and the normalization can accelerate training speed of the proxy model, improve their generalization ability and robustness.

In an embodiment, the pre-proxy model includes parallel modules with a number of M, the M parallel modules share weight parameters and bias parameters, and each of the M parallel modules includes a first hidden layer, a concatenation layer, and a second hidden layer. The first hidden layer includes a first unit, a second unit, a third unit, a fourth unit, and a fifth unit. Preprocessed center coordinate points and test data of an m-th triangular facet of the M triangular facets are input into the first unit, the second unit, the third unit, the fourth unit, and the fifth unit of the first hidden layer of an m-th parallel module of the M parallel modules, and a structural response value of the m-th triangular facet is output by each of the first unit, the second unit, the third unit, the fourth unit, and the fifth unit of the first hidden layer of an m-th parallel module of the M parallel modules. The concatenation layer of the m-th parallel module is configured to concatenate outputs of the structural response value of the m-th triangular facet output by the first, second, third, fourth, and fifth units of the first hidden layer of the m-th parallel module. The concatenation layer of the m-th parallel module is configured to output a combined vector of a size of 1×15. The combined vector output by the concatenation layer of the m-th parallel module is input into the second hidden layer of the m-th parallel module, and the structural response value of the m-th triangular facet is output by the second hidden layer of the m-th parallel module. The proxy model includes the pre-proxy model, and an output of the second hidden layer of the proxy model is represented as the structural response value at the future time point G. The proxy model includes a linear layer, and the linear layer is configured to generate the warning values based on the structural response values of the M triangular facets at the future time point G.

In an embodiment, each of the digital twin monitoring model, the pre-proxy model, the proxy model and the parallel modules is embodied by at least one processor and at least one memory coupled to the at least one processor, and the at least one memory stores computer programs executable by the at least one processor.

It should be noted that through simulation experiments, a large number of training samples can be obtained from the first training dataset. The pre-training on the first training dataset allows the pre-proxy model to learn the data characteristics of the slopes under multiple physical field conditions. Then, transferring the pre-trained pre-proxy model to the proxy model can greatly accelerate the training speed of the proxy model, thereby reducing the number of the training samples in the second training dataset. This is because simulation data has a lower cost compared to real-time monitoring data, and training on the second training dataset enables the proxy model to predict changes in the structural response values of the slopes, in order to generate the warning cloud map of the slopes. In addition, the number of M parallel modules is the same as the number of M triangular facets in the slope geometry model, and the design of M parallel modules can accelerate computation speed of the proxy model.

In an embodiment, the first unit is constructed based on an XGBoost, the second unit is constructed based on a support vector machine with radial basis function, the third unit is constructed based on a support vector machine with polynomial kernel function, the fourth unit is constructed based on random forest (RF), and the fifth unit is constructed based on a K-nearest neighbor algorithm.

In an embodiment, the second hidden layer is constructed based LightGBM.

It should be noted that the XGBoost reduces the error of previous trees by adding new decision trees gradually. The LightGBM splits the current optimal leaf nodes instead of splitting level by level like the XGBoost, which can reduce the loss function faster and converge more quickly. The RF consists of multiple decision trees trained independently, with the prediction being the average of all trees' predictions. The radial basis function is similar to the support vector machine but differs in the type of polynomial kernel function used.

In an embodiment, due to the limited number of training samples in the second training dataset, the proxy model is trained by using a five-fold cross-validation method, the second training dataset is divided into five equally-sized subsets. In each training iteration, one of the five equally-sized subsets is selected to serve as a validation set and the remaining four of the five equally-sized subsets is selected as a training set.

In an embodiment, a calculation formula for a loss function $Loss_1$ of the pre-proxy model is expressed as follows:

$$Loss_1 = \frac{1}{A} \times \sum_{a=1}^{A}(\widetilde{y_a} - y_a)^2$$

where $\widetilde{y_a}$ represents an output value (i.e., the third sample label) of the pre-proxy model when sample data of a-th training sample in the first training dataset is input into the pre-proxy model; $y_a$ represents a sample label (i.e., the first sample label) of the a-th training sample. A calculation formula for a loss function $Loss_2$ of the proxy model is expressed as follows:

$$Loss_2 = \begin{cases} \frac{1}{2}(\widetilde{y_b} - y_b)^2, & \text{if } |\widetilde{y_b} - y_b| \leq \delta \\ \delta|\widetilde{y_b} - y_b| - \frac{1}{2}\delta^2, & \text{if } |\widetilde{y_b} - y_b| > \delta \end{cases}$$

where $1 \leq b \leq B$; $\widetilde{y_b}$ represents an output value (i.e., the fourth sample label) of the proxy model when sample data of b-th training sample in the second training dataset is input into the pre-proxy model; $y_b$ represents a sample label (i.e., the second sample label) of the b-th training sample; and $\delta$ represents a custom parameter, preferably, $\delta$ is set to 1.5.

It should be noted that gradients of the weights and biases in the pre-proxy model and the proxy model are computed using a chain rule. Then, the gradients are used to update the weights and biases via a gradient descent, minimizing the loss functions.

In an embodiment, a calculation formula for a warning value $Fore_m$ of the m-th triangular facet of the M triangular facets is expressed as follows:

$$Fore_m = \frac{255}{1 + e^{-(u_1 \times water_m + u_2 \times move_m + u_3 \times pressure_m)}}$$

where $1 \leq m \leq M$; $water_m$, $move_m$, and $pressure_m$ represent a pore water pressure, a displacement, and a soil pressure of the m-th triangular facet respectively; $u_1$, $u_2$, and $u_3$ represent a first weight coefficient, a second weight coefficient, and a third weight coefficient, respectively; and $u_1$, $u_2$, and $u_3$ are the custom parameters, and a sum of $u_1$, $u_2$, and $u_3$ is 1, and e represents a natural constant.

It should be noted that a higher warning value indicates a greater slope danger, and the warning value is in a range of 0 to 255. The warning value can be used to create a grayscale image or divided into three ranges corresponding to red, green, and blue channel values. Additionally, the pore water pressure, the displacement, and the soil pressure of each of the M triangular facets can be scaled to the range of 0 to 255 to generate a red, green, and blue (RGB) image.

In an embodiment, the generating a warning cloud map of the slopes based on the output of the trained proxy model includes a step as follows. The warning values of the M triangular facets are rendered onto the corresponding M triangular facets by using a unity rendering engine, respectively, thereby to generate the warning cloud map of the slopes. The warning cloud map of the slopes real-time shows status of the slopes. In addition, threshold-based warning measures can be adopted. For example, if the warning value is equal or greater than 80, the monitoring frequency needs to be increased, if the warning value is equal or greater than 160, staff needs to be dispatched for on-site inspection. Details are not further elaborated here.

The above describes the embodiments of the disclosure, but the disclosure is not limited to the specific embodiments described above. The specific embodiments described above are only illustrative and not restrictive. Those skilled in the art can also make many forms under the inspiration of the embodiments, all of which are within the protection of the disclosure.

What is claimed is:

1. A method for constructing a digital twin monitoring model for slopes based on a proxy model, the method comprising the following steps:

S101, collecting elevation information of the slopes by using a drone oblique photography technology, and constructing a slope geometric model consisting of triangular facets with a number of M by using a three-dimension (3D) reconstruction software;

S102: performing, by using the slope geometry model, simulation experiments under multiple physical field conditions to obtain simulation data and simulation results, constructing, based on the simulation data and simulation results, a first training dataset for pretraining a pre-proxy model, and pretraining, based on the first training dataset, the pre-proxy model to thereby obtain a pretrained pre-proxy model,
wherein the multiple physical field conditions comprise: a rainfall condition, an earthquake condition, and a mining condition in a mining area;
wherein the simulation data comprises center coordinate points and test data of the M triangular facets at a current time, the center coordinate points are represented by a horizontal coordinate value X, a vertical coordinate value Y, and an elevation coordinate value Z; and the test data comprises temperatures, rainfalls, soil moistures, groundwater levels, wind speeds, wind direction slope deviation angles, and vegetation densities;
wherein the simulation results are represented by structural response values of the M triangular facets at the current time, and the structural response values comprise pore water pressures, displacements, and soil pressures;
wherein an input of the pre-proxy model is the simulation data after preprocessing, and an output of the pre-proxy model is the simulation results; and
wherein the first training dataset comprises training samples with a number of A, each of the A training samples comprises sample data and a sample label, the sample data of each of the A training samples corresponds to the input of the pre-proxy model, and the sample label of each of the A training samples corresponds to the output of the pre-proxy model;

S103, transferring the pretrained pre-proxy model to the proxy model, collecting monitoring data of the M triangular facets in real-time to construct a second training dataset for training the proxy model, and training, based on the second training dataset, the proxy model to thereby obtain a trained proxy model,
wherein the monitoring data of the M triangular facets are represented in a same way as the simulation data;
wherein an input of the proxy model is the input of the pre-proxy model, an output of the proxy model is warning values of the M triangular facets at a future time point G, and the warning values are generated based on structural response values of the M triangular facets at the future time point G; and
wherein the second training dataset comprises training samples with a number of B, each of the B training samples comprises sample data and a sample label, the sample data of each of the B training samples corresponds to the input of the proxy model, and the sample label of each of the B training samples corresponds to the output of the proxy model; and S104, inputting the monitoring data of the M triangular facets into the trained proxy model to obtain an output of the trained proxy model, and generating a warning cloud map of the slopes based on the output of the trained proxy model.

2. The method as claimed in claim 1, wherein the number M of the triangular facets in the slope geometric model, the number A of the training samples in the first training dataset, the number B of the training samples in the second training dataset, and the future time point G are custom parameters.

3. The method as claimed in claim 1, further comprising: preprocessing the center coordinate points and the test data of the M triangular facets at the current time, comprising:
S201, converting the wind direction slope deviation angles and the vegetation densities in the test data into numerical values,
wherein a calculation formula for a wind direction slope deviation angle $\Delta\theta_m$ of an m-th triangular facet of the M triangular facets is expressed as follows:

$$\Delta\theta_m = \cos\left|\frac{\theta_m^w}{\theta_m^s}\right|$$

where m is greater than or equal to 1 and less than or equal to M; $\theta_m^w$ represents a wind direction of the m-th triangular facet, a wind direction in a truth north is represented by 0°, a clockwise direction is defined as a positive direction, $\theta_m^w$ is in a range from 0° to 360°; and $\theta_m^s$ represents a slope of the m-th triangular facet, $\theta_m^s$ is an angle between the m-th triangular facet and a ground plane, and $\theta_m^s$ is in a range from 0° to 90°; and
wherein a calculation formula for a vegetation density $Density_m$ of the m-th triangular facet is expressed as follows:

$$Density_m = 2.5 \times \frac{(NIR_m - Red_m)}{(NIR_m + 6 \times Red_m - 7.5 \times Blue_m + 1)}$$

where $NIR_m$, $Red_m$ and $Blue_m$ represent reflectance values of the m-th triangular facet in a near-infrared band, a red band, and a blue band, respectively;

S202, determining an average value of center coordinate points of every two adjacent triangular facets of the M triangular facets and an average value of the test data of the every two adjacent triangular facets of the M triangular facets, and filling missing values, based on the average value of the center coordinate points of the every two adjacent triangular facets of the M triangular facets and the average value of the test data of the every two adjacent triangular facets of the M triangular facets, into the simulation data; and S203, normalizing the center coordinate points and the test data of the M triangular facets, wherein a calculation formula for the normalizing is expressed as follows:

$$\widetilde{Data_m} = \frac{Data_m - \min(Data)}{\max(Data) - \min(Data)}$$

where $1 \leq m \leq M$; $\widetilde{Data_m}$ and $Data_m$ represent the center coordinate points and the test data of the m-th triangular facet after the preprocessing and before the preprocessing, respectively; and min(Data) and max(Data) represent a minimum value and a maximum value of the center coordinate points and the test data of the M triangular facets.

4. The method as claimed in claim 1, wherein the pre-proxy model comprises parallel modules with a number of M, the M parallel modules share weight parameters and bias parameters, and each of the M parallel modules comprises a first hidden layer, a concatenation layer, and a second hidden layer;
- wherein the first hidden layer comprises a first unit, a second unit, a third unit, a fourth unit, and a fifth unit;
- wherein preprocessed center coordinate points and test data of an m-th triangular facet of the M triangular facets are input into the first unit, the second unit, the third unit, the fourth unit, and the fifth unit of the first hidden layer of an m-th parallel module of the M parallel modules, and a structural response value of the m-th triangular facet is output by each of the first unit, the second unit, the third unit, the fourth unit, and the fifth unit of the first hidden layer of an m-th parallel module of the M parallel modules;
- wherein the concatenation layer of the m-th parallel module is configured to concatenate the structural response value of the m-th triangular facet output by the first, second, third, fourth, and fifth units of the first hidden layer of the m-th parallel module; and the concatenation layer of the m-th parallel module is configured to output a combined vector of a size of 1×15;
- wherein the combined vector output by the concatenation layer of the m-th parallel module is input into the second hidden layer of the m-th parallel module, and the structural response value of the m-th triangular facet is output by the second hidden layer of the m-th parallel module;
- wherein the proxy model comprises the pre-proxy model, and an output of a second hidden layer of the proxy model is represented as the structural response value at the future time point G; and
- wherein the proxy model comprises a linear layer, and the linear layer is configured to generate the warning values based on the structural response values of the M triangular facets at the future time point G.

5. The method as claimed in claim 4, wherein the first unit is constructed based on an extreme gradient boosting decision tree (XGBoost), the second unit is constructed based on a support vector machine with radial basis function, the third unit is constructed based on a support vector machine with polynomial kernel function, the fourth unit is constructed based on random forest, and the fifth unit is constructed based on a K-nearest neighbor algorithm.

6. The method as claimed in claim 4, wherein the second hidden layer is constructed based on a light gradient boosting machine (LightGBM).

7. The method as claimed in claim 1, wherein the training, based on the second training dataset, the proxy model to thereby obtain a trained proxy model comprises:
- training, by using a five-fold cross-validation method, the proxy model, dividing the second training dataset into five equally-sized subsets; and in each training iteration, selecting one of the five equally-sized subsets to serve as a validation set and using the remaining four of the five equally-sized subsets as a training set.

8. The method as claimed in claim 1, wherein a calculation formula for a loss function $Loss_1$ of the pre-proxy model is expressed as follows:

$$Loss_1 = \frac{1}{A} \times \sum_{a=1}^{A}(\widetilde{y_a} - y_a)^2$$

where $\widetilde{y_a}$ represents an output value of the pre-proxy model when sample data of a-th training sample in the first training dataset is input into the pre-proxy model, and $y_a$ represents a sample label of the a-th training sample; and wherein a calculation formula for a loss function $Loss_2$ of the proxy model is expressed as follows:

$$Loss_2 = \begin{cases} \frac{1}{2}(\widetilde{y_b} - y_b)^2, & \text{if} |\widetilde{y_b} - y_b| \leq \delta \\ \delta|\widetilde{y_b} - y_b| - \frac{1}{2}\delta^2, & \text{if} |\widetilde{y_b} - y_b| > \delta \end{cases}$$

where $1 \leq b \leq B$; $\widetilde{y_b}$ represents an output value of the proxy model when sample data of b-th training sample in the second training dataset is input into the proxy model; $y_b$ represents a sample label of the b-th training sample; and $\delta$ represents a custom parameter.

9. The method as claimed in claim 1, wherein a calculation formula for a warning value $Fore_m$ of an m-th triangular facet of the M triangular facets is expressed as follows:

$$Fore_m = \frac{255}{1 + e^{-(u_1 \times water_m + u_2 \times move_m + u_3 pressure_m)}}$$

where $1 \leq m \leq M$; $water_m$, $move_m$, and $pressure_m$ represent a pore water pressure, a displacement, and a soil pressure of the m-th triangular facet respectively; $u_1$, $u_2$, and $u_3$ represent a first weight coefficient, a second weight coefficient, and a third weight coefficient, respectively; and $u_1$, $u_2$, and $u_3$ are custom parameters, and a sum of $u_1$, $u_2$, and $u_3$ is 1, and e represents a natural constant.

10. The method as claimed in claim 1, wherein the generating a warning cloud map of the slopes based on the output of the trained proxy model comprises:
- rendering, by using a unity rendering engine, the warning values of the M triangular facets onto the M triangular facets, respectively, thereby to generate the warning cloud map of the slopes.

* * * * *